United States Patent
Akamatsu et al.

(10) Patent No.: US 9,853,195 B2
(45) Date of Patent: Dec. 26, 2017

(54) SEMICONDUCTOR LIGHT-EMITTING DEVICE AND METHOD FOR PRODUCING THE SAME

(71) Applicant: KABUSHIKI KAISHA TOSHIBA, Tokyo (JP)

(72) Inventors: Yuki Akamatsu, Nomi Ishikawa (JP); Yoshio Noguchi, Komatsu Ishikawa (JP); Masahiro Ogushi, Nonoichi Ishikawa (JP); Teruo Takeuchi, Yokohama Kanagawa (JP); Toshihiro Kuroki, Kokubunji Tokyo (JP); Hidenori Egoshi, Nonoichi Ishikawa (JP); Takashi Arakawa, Hakusan Ishikawa (JP); Kazuhiro Inoue, Komatsu Ishikawa (JP); Toshihiro Komeya, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/060,534

(22) Filed: Mar. 3, 2016

(65) Prior Publication Data
US 2016/0308099 A1     Oct. 20, 2016

(30) Foreign Application Priority Data
Apr. 17, 2015   (JP) .................................. 2015-084952

(51) Int. Cl.
*H01L 33/62*   (2010.01)
*H01L 33/60*   (2010.01)
(Continued)

(52) U.S. Cl.
CPC ............ *H01L 33/60* (2013.01); *H01L 33/486* (2013.01); *H01L 33/54* (2013.01); *H01L 33/62* (2013.01); *H01L 2933/0066* (2013.01)

(58) Field of Classification Search
CPC ....... H01L 33/60; H01L 33/486; H01L 33/54; H01L 2933/0066; H01L 33/62
(Continued)

(56) References Cited

U.S. PATENT DOCUMENTS 8,871,539 B2 * 10/2014 Lin ..................... H01L 33/0079
                                                                257/98
9,461,220 B2    10/2016 Ikenaga et al.
(Continued)

FOREIGN PATENT DOCUMENTS

JP   2016063210 A    4/2016
TW     201250964 A   12/2012
(Continued)

OTHER PUBLICATIONS

Taiwan Office Action dated Oct. 21, 2016, filed in Taiwan counterpart Application No. 105107637, 10 pages (with translation).

*Primary Examiner* — Bo Fan
(74) *Attorney, Agent, or Firm* — Patterson & Sheridan, LLP (57) ABSTRACT

A light-emitting device includes a semiconductor light-emitting element, for example, a light emitting diode. A first metal member includes a first metal plate and a first metal layer between the semiconductor light-emitting element and a first surface of the first metal plate. An insulating layer contacts a second surface of the first metal plate. The second surface is in a second plane that intersects a first plane of the first surface.

10 Claims, 6 Drawing Sheets

(51) Int. Cl.
*H01L 33/48* (2010.01)
*H01L 33/54* (2010.01)

(58) Field of Classification Search
USPC ....... 257/98, 99, 300, 318, 319; 438/29, 643
See application file for complete search history.

(56) References Cited

U.S. PATENT DOCUMENTS

| | | | | |
|---|---|---|---|---|
| 2007/0298268 A1* | 12/2007 | Haitko | ................... | C09J 183/08 |
| | | | | 428/447 |
| 2012/0153335 A1 | 6/2012 | Matsushita et al. | | |
| 2012/0273826 A1* | 11/2012 | Yamamoto | .............. | H01L 24/97 |
| | | | | 257/99 |
| 2013/0087825 A1* | 4/2013 | Umakoshi | ............... | H01L 33/60 |
| | | | | 257/99 |
| 2015/0155459 A1 | 6/2015 | Ishihara et al. | | |
| 2016/0079217 A1 | 3/2016 | Egoshi et al. | | |

FOREIGN PATENT DOCUMENTS

| | | |
|---|---|---|
| TW | 201405056 A | 2/2014 |
| TW | 201432960 A | 8/2014 |

\* cited by examiner

SEMICONDUCTOR LIGHT-EMITTING DEVICE AND METHOD FOR PRODUCING THE SAME

CROSS-REFERENCE TO RELATED APPLICATION

This application is based upon and claims the benefit of priority from Japanese Patent Application No. 2015-084952, filed Apr. 17, 2015, the entire contents of which are incorporated herein by reference.

FIELD

Embodiments described herein relate generally to semiconductor light-emitting devices and methods for producing semiconductor light-emitting devices.

BACKGROUND

In a semiconductor light-emitting device, a semiconductor light-emitting element such as a light emitting diode (LED) is mounted on a member such as a lead frame. The semiconductor light-emitting device is required to be produced with high productivity.

DETAILED DESCRIPTION

In general, according to an embodiment, a semiconductor light-emitting device includes a semiconductor light-emitting element, a first metal member including a first metal plate and a first metal layer between the semiconductor light-emitting element and a first surface of the first metal plate, and an insulating layer comprising silicon oxide contacting a second surface of the first metal plate. The first metal member comprises copper and the first metal layer comprises silver. The second surface is in a second plane that crosses a first plane of the first surface.

Hereinafter, embodiments will be described with reference to the drawings. The drawings are schematic or conceptual drawings and the relationship between the depicted thickness and width of each portion and/or the size ratio between the depicted portions are not always identical to the actual relationship and size ratio in actual device. Moreover, the same portion or element may sometimes be illustrated in different drawings with different sizes or ratios. Incidentally, in the specification and the drawings, the elements substantially similar to those described in an already explained drawing will be identified with the same reference numerals and the detailed explanations thereof will be omitted when appropriate.

First Embodiment

FIGS. 1A to 1D are schematic diagrams illustrating a semiconductor light-emitting device according to a first embodiment.

Figure 1A:
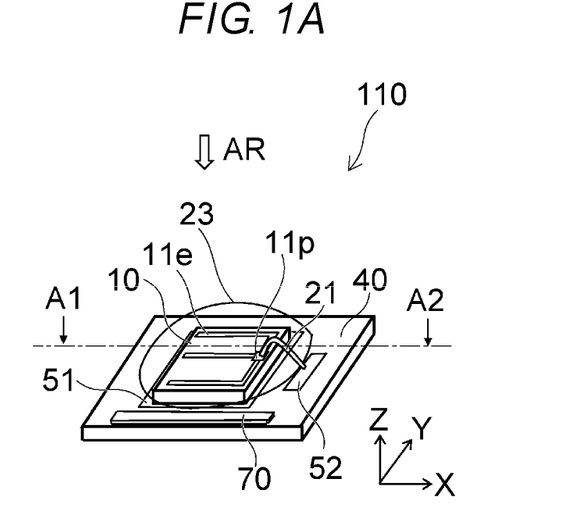
FIGS. 1A to 1D are schematic diagrams illustrating a semiconductor light-emitting device according to a first embodiment.
Figure 1B:
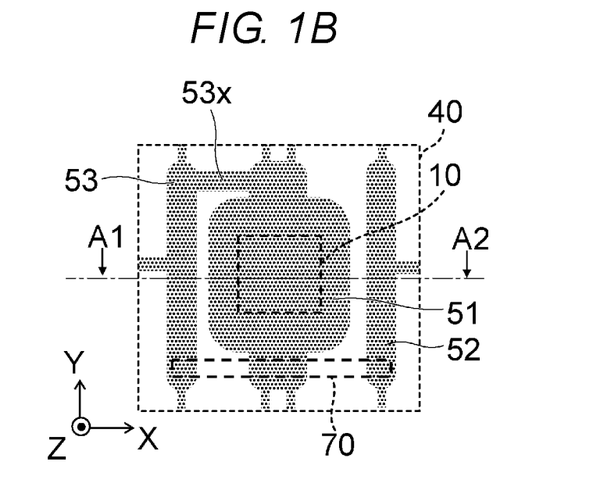
Figure 1C:
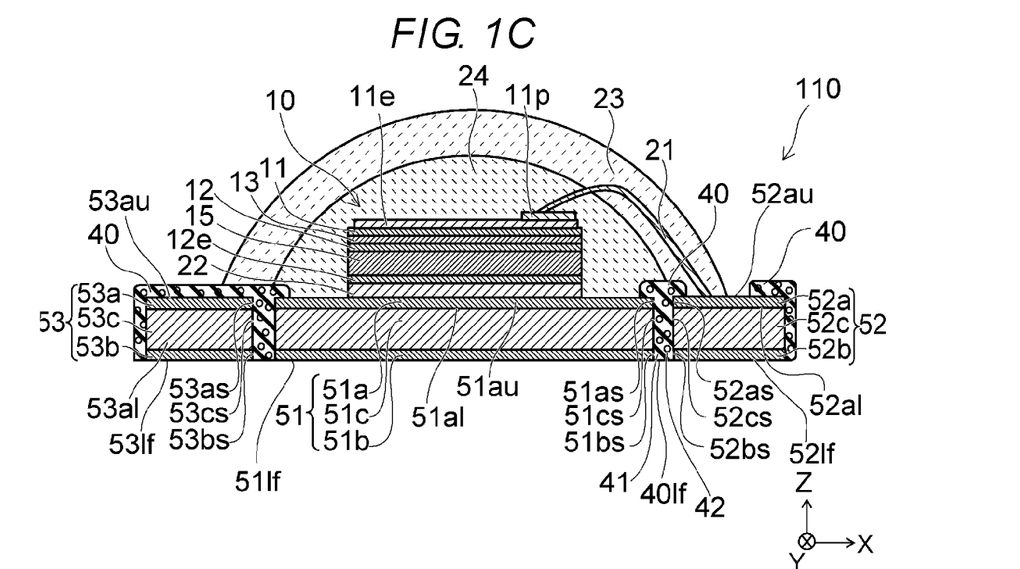
Figure 1D:
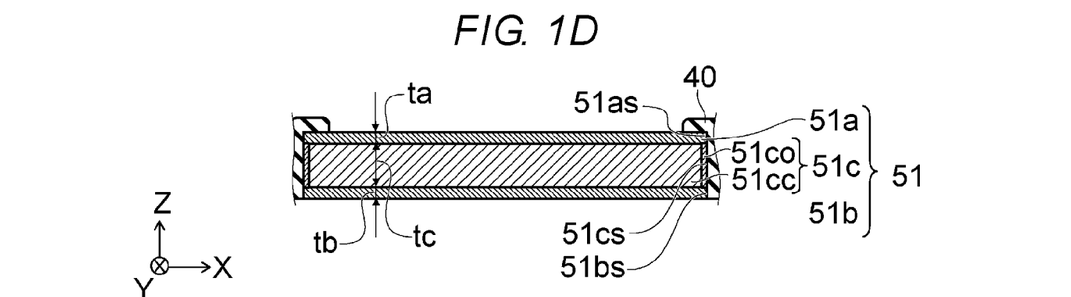

FIG. 1A is a perspective view of the semiconductor light-emitting device. FIG. 1B is a plan view illustrating a portion of the semiconductor light-emitting device as viewed in the direction of an arrow AR of FIG. 1A. In FIG. 1B, some elements are indicated by dashed lines or as shaded outlines. FIG. 1C is a cross-sectional view of the semiconductor light-emitting device taken on the line A1-A2 illustrated in FIGS. 1A and 1B. FIG. 1D is a cross-sectional view illustrating a portion of the semiconductor light-emitting device.

As illustrated in FIG. 1A, a semiconductor light-emitting device 110 includes a semiconductor light-emitting element 10, a first metal member 51, and an insulating material 40. In this example, the semiconductor light-emitting device 110 further includes a second metal member 52.

In FIG. 1C, for purposes of explanation, the semiconductor light-emitting element 10 is illustrated as being relatively thicker than the semiconductor light-emitting element 10 would typically be in an actual device.

As illustrated in FIG. 1C, the first metal member 51 includes a first metal plate 51c and a first upper metal layer 51a. In this example, the first metal member 51 further includes a first lower metal layer 51b. Between the first upper metal layer 51a and the first lower metal layer 51b, a first metal plate 51c is provided. Here, the first metal plate 51c contains copper (Cu). The first metal plate 51c is, for example, a copperplate. The first upper metal layer 51a contains silver (Ag), for example. The first metal layer 51a is, for example, a metallic silver layer. The first lower metal layer 51b contains silver, for example. The first lower metal layer 51b is, for example, a metallic silver layer.

For example, on the surface of the first metal plate 51c, the silver layer is formed by plating. As a result, the first upper metal layer 51a (and the first lower metal layer 51b) is formed. The silver layer may also be formed by a vapor deposition process.

Between the semiconductor light-emitting element 10 and the first metal plate 51c, the first upper metal layer 51a is disposed. The semiconductor light-emitting element 10 is, for example, a light-emitting diode (LED) chip.

A first direction of the semiconductor light-emitting element 10 from the first upper metal layer 51a is assumed to be a Z-axis direction. One direction perpendicular to the Z-axis direction is assumed to be an X-axis direction. A direction perpendicular to the Z-axis direction and the X-axis direction is assumed to be a Y-axis direction. An interface (a face corresponding to a first lower surface 51a1) between the first upper metal layer 51a and the first metal plate 51c is parallel to an X-Y plane.

The second metal member 52 is located next to the first metal member 51 in a direction intersecting the first direction (Z-axis).

The second metal member 52 includes a second metal plate 52c and a second upper metal layer 52a. The second upper metal layer 52a and at least a portion of the second metal plate 52c overlap each other in the first direction. In this example, the second metal member 52 further includes a second lower metal layer 52b. Between the second upper metal layer 52a and the second lower metal layer 52b, the second metal plate 52c is provided. The second metal plate 52c contains copper. The second upper metal layer 52a contains silver, for example. The second lower metal layer 52b contains silver, for example. For instance, on the surface of the second metal plate 52c, a silver layer is formed by plating, whereby the second upper metal layer 52a (and the second lower metal layer 52b) is formed. The silver layer may also be formed by a vapor deposition process.

In this example, a third metal member 53 is further provided. The third metal member 53 is located next to the first metal member 51 in a direction intersecting the first direction (Z-axis). In this example, between the third metal member 53 and the second metal member 52, the first metal member 51 is disposed.

The third metal member 53 includes a third metal plate 53c and a third upper metal layer 53a. The third upper metal layer 53a and at least a portion of the third metal plate 53c overlap each other in the first direction. In this example, the third metal member 53 further includes a third lower metal layer 53b. Between the third upper metal layer 53a and the third lower metal layer 53b, the third metal plate 53c is provided. The third metal plate 53c contains copper. The third upper metal layer 53a contains silver, for example. The third lower metal layer 53b contains silver, for example. For instance, on the surface of the third metal plate 53c, a silver layer is formed by plating, whereby the third metal layer 53a (and the third lower metal layer 53b) is formed. The silver layer may also be formed by a vapor deposition process.

FIG. 1B illustrates the first metal member 51, the second metal member 52, and the third metal member 53. As illustrated in FIG. 1B, the second metal member 52 is spaced from the first metal member 51. The second metal member 52 is electrically insulated from the first metal member 51. In this example, a connecting member 53x is provided. The third metal member 53 is electrically connected to the first metal member 51 by the connecting member 53x. These various metal members are, for example, lead frames or portions of lead frames.

The insulating material 40 is provided on at least a portion of the first metal member 51. The insulating material 40 contains a silicon oxide 41. Here, a "silicon oxide" as used here includes silicon dioxide ($SiO_2$) as a non-limiting example. In this example, the insulating material 40 also contains a plurality of particles 42. The plurality of particles 42 contains, for example, at least one of a zinc oxide and a titanium oxide. The insulating material 40 reflects light, for example. The optical reflectance of the insulating material 40 disposed in a layer is higher than the optical reflectance of the first metal plate 51c, for example.

The insulating material 40 at least partially encloses the first metal member 51 and the second metal member 52, for example. The insulating material 40 is between the first metal member 51 to the second metal member 52, for instance and can function to hold these metal members together. The insulating material 40 fixes the position of the second metal member 52 with respect to the first metal member 51. The insulating material 40 holds the first metal member 51 and the second metal member 52 together while providing electrical insulation between the first metal member 51 and the second metal member 52.

As illustrated in FIG. 1C, the first metal plate 51c has a first metal plate side face 51cs. The first metal plate side face 51cs intersects the X-Y plane (the plane perpendicular to the first direction). The first upper metal layer 51a has a first upper metal layer side face 51as. The first upper metal layer side face 51as intersects the X-Y plane. The first lower metal layer 51b has a first lower metal layer side face 51bs. The first lower metal layer side face 51bs intersects the X-Y plane.

The second metal plate 52c has a second metal plate side face 52cs. The second metal plate side face 52cs intersects the X-Y plane. The second upper metal layer 52a has a second upper metal layer side face 52as. The second upper metal layer side face 52as intersects the X-Y plane. The second lower metal layer 52b has a second lower metal layer side face 52bs. The second lower metal layer side face 52bs intersects the X-Y plane.

In this embodiment, the insulating material 40 is in contact with the first metal plate side face 51cs. In this example, the insulating material 40 is in contact with the first upper metal layer side face 51as. The insulating material 40 is in contact with the first lower metal layer side face 51bs. The insulating material 40 is in contact with the second metal plate side face 52cs. The insulating material 40 is in contact with the second upper metal layer side face 52as. The insulating material 40 is in contact with the second lower metal layer side face 52bs.

With such a semiconductor light-emitting device 110, higher productivity is achieved as compared to a comparative reference example in which the first metal plate side face 51cs of the first metal plate 51c is covered with a silver layer. The configuration of this reference example is obtained by forming a metal plate by processing a copper plate into a metal plate with a predetermined shape and forming a silver layer on the surface of this shaped metal plate by plating or the like. Therefore, in this reference example, the outer surfaces of the copper metal plate are covered with the silver layer. In this case, the insulating material 40 is in contact with only the silver layer and is thus not in direct contact with the surface of the copper metal plate itself. In such a reference example, a crack or the like sometimes appears in the insulating material 40. The insulating material 40 has a portion which is in contact with a corner portion of the silver-plated metal member. The crack tends to appear proximate to this corner portion.

For instance, in a process of producing the semiconductor light-emitting device, the insulating material 40 holds a plurality of (at least two) metal members. After this process, stress in different directions may be applied to these metal members. At this time, this stress is applied to the insulating material 40 and a crack appears in the insulating material 40. Separation sometimes occurs between the insulating material 40 and the metal members. As a result, the metal members are sometimes displaced from their predetermined positions, and this becomes a cause of a defective piece. Additionally the insulation between the metal members can be degraded by the cracking. As a result, for example, device reliability is sometimes decreased. For instance, the measured device lifetime in a high-temperature and high-humidity operation test is sometimes shortened.

Such a problem arises especially when the insulating material 40 has light reflectivity and high mechanical strength. In the semiconductor light-emitting device, the light emitted from the semiconductor light-emitting element 10 is reflected from the insulating material 40 and is made to exit to the outside. In order to attain high light reflectivity, for example, a plurality of particles 42 is provided in the insulating material 40. A matrix or binder material is provided around the plurality of particles 42 and this material is required to have low light absorptivity. Furthermore, the matrix or binder material is irradiated with a high-intensity light from the semiconductor light-emitting element 10. Thus, the matrix or binder material is required to have resistance to light—that is, the material does not quickly degrade or otherwise breakdown upon exposure to light emitted by the light-emitting element 10. In addition, the insulating material 40 is required to have high mechanical strength. The high mechanical strength allows the insulating material 40 to stably hold the metal members. For example, if a highly-flexible material is used as the matrix material in the insulating material 40, high overall mechanical strength is not easily achieved by the insulating material 40.

As a result, in the configuration in which the insulating material 40 is intended to hold the (at least two) metal members (which may be lead frames or portions thereof) away from each other, the possible range of the matrix material used in the insulating material 40 is limited to those materials which are not significantly flexible. Thus, there is a limit to what one may do to suppress a crack or separation of the insulating material 40 by changing the material used in the insulating material 40.

Such a problem arises especially in a configuration in which the semiconductor light-emitting element 10 and a plurality of metal members are used and the metal members are required to be held by an insulating material layer with stability while still providing high optical reflectance.

In the present disclosure, a lead frame production process is changed. That is, according to present disclosure, a silver layer is formed on the surface of the copper plate, and then the silver layer and the copper plate are processed to have a predetermined shape. It was found that a crack and separation of the insulating material 40 could be suppressed when used in conjunction with shaped silver-coated copper plates obtained by such a process.

By this process, the side face(s) of the copper plate is (are) not covered with the silver layer. As a result, the side face(s) of the copper plate is (are) exposed. The insulating material 40 is thus in contact with the side face of the copper plate without an intervening silver layer between the side face and the insulating material 40. Since in general the surface energy of copper is higher than the surface energy of silver, the adhesion between the insulating material 40 and copper is greater than the adhesion between the insulating material 40 and silver.

An experiment conducted by the inventors reveals that the shear strength of the lead frame is about 335 gf/mm$^2$ (gram-force/mm$^2$) when the insulating material 40 is formed on the copper layer. The experiment reveals that the shear strength of the lead frame is about 12 gf/mm$^2$ when the insulating material 40 is formed on the silver layer. The adhesion between the insulating material 40 and copper is high compared to the adhesion between the insulating material 40 and silver.

In the first embodiment, the insulating material 40 is in contact with the first metal plate side face 51cs. As a result, a high adhesion is achieved between the insulating material 40 and the first metal plate side face 51cs. Furthermore, by being in contact with the second metal plate side face 52cs, the insulating material 40 achieves a high adhesion between the insulating material 40 and the second metal plate side face 52cs. As a result, cracking or the like in the insulating material 40 may be suppressed, which results in an enhanced manufacturing yield and higher productivity.

The strength of the packaged device is measured by applying stress to the semiconductor light-emitting device. For instance, when high stress is applied to the insulating material 40, the positions of the metal members are changed and the insulating material 40 is broken. In such a package strength test, the package strength of the semiconductor light-emitting device 110 according to an embodiment is about 5 N (Newton), for example, between 4.4 N and 5.6 N. On the other hand, in the above-described comparative reference example (in which the entire surface of the copper plate is covered with the silver layer), the package strength is about 4 N (3.3 N-4.6 N).

As illustrated in FIG. 1D, the first metal plate 51c has a thickness tc in the first direction (Z-axis). The first upper metal layer 51a has a thickness ta in the first direction. The first lower metal layer 51b has a thickness tb in the first direction.

The thickness tc is greater than the thickness ta and the thickness tb. As a result, the contact area between the first metal plate 51c and the insulating material 40 is increased.

For example, the thickness tc is, for example, 500 to 5,000 times the thickness ta. When the thickness tc is less than 500 times the thickness ta, the overall adhesion between the insulation material 40 and the metal plate may become insufficient. When the thickness tc is more than 5,000 times the thickness ta, the first upper metal layer 51a a desired reflection property of the first upper metal layer 51a may not be easily achieved. Also, if the first metal plate 51c is excessively thick, then the device becomes thick as a whole. Likewise, the thickness tc is, for example, 500 to 5,000 times the thickness tb.

For instance, the thickness ta is 2 μm to 10 μm. When the thickness ta is less than 2 μm, a high and uniform reflectance may not be easily achieved, for example. When the thickness to exceeds 10 μm, a crack may tend to appear in the first upper metal layer 51a, for instance. In addition, the production cost is increased with thicker silver layers.

For example, the thickness tc is 0.2 mm to 1 mm. When the thickness tc is less than 0.2 mm, the mechanical strength of the device is reduced, for instance. When the thickness tc exceeds 1 mm, the semiconductor light-emitting device becomes thicker. Furthermore, the production cost is increased with thicker copper plates.

As illustrated in FIG. 1D, the first metal plate 51c can include a first region 51cc and a second region 51co. The first region 51cc contains copper. The first region 51cc is, for example, a metallic copper. The second region 51cc is provided between (in the X-axis direction) the first region 51cc and the insulating material 40. The concentration of oxygen in the second region 51co is higher than the concentration of oxygen in the first region 51cc. The second region 51co is an oxide of copper, for example. The second region 51co is, for example, a copper oxide film on the surface (the side face) of the first region 51cc. In this case, the first metal plate side face 51cs of the first metal plate 51c corresponds to the side face of the second region 51co.

For example, when the first metal plate side face 51cs is a copper oxide, a chemical bond (for example, a hydrogen bond) can be formed between the insulating material 40 and the copper oxide. As a result, the adhesion between the first metal plate side face 51cs and the insulating material 40 is enhanced, which further improves productivity and reliability.

In this example embodiment, the content of the silicon oxide 41 in the insulating material 40 is 40% or more (by mass). In other embodiments, the content of the silicon oxide 41 in the insulating material 40 may be 50% or more (by mass). In other embodiments, the content of the silicon oxide 41 in the insulating material 40 is 70% or less (by mass) and, in still other embodiments, the content of the silicon oxide 41 in the insulating material 40 may be 60% or less (by mass). In general, the content of the silicon oxide 41 in the insulating material 40 is within a range of 40% to 70% (by mass).

In this example embodiment, the content of the plurality of particles 42 in the insulating material 40 is 20% or more (by mass). In other embodiments, the content of the plurality of particles 42 in the insulating material 40 may be 30% or more (by mass). In still other embodiments, the content of the plurality of particles 42 in the insulating material 40 is 50% or less (by mass), for example. In yet other embodiments, the content of the plurality of particles 42 in the insulating material 40 may be 40% or less (by mass). In general, the content of the plurality of particles 42 in the insulating material 40 is within a range of 20% to 50% (by mass).

The insulating material 40 may further include organic matter as a component. The insulating material 40 may further include a coupling agent as component. These additional components may improve adhesion to between insulating material 40 and first metal member 51. The insulating material 40 may also include a component having a hydrocarbon group. The insulating material 40 may include a component having an unsaturated bond (such as an unsaturated hydrocarbon group). The insulating material 40 may include a siloxane compound, which may function to increase the flexibility of the insulating material 40, which facilitates the alleviation of applied or generated stresses and thus suppresses crack formation or the like.

As illustrated in FIG. 1C, the first metal layer 51a has a first upper surface 51au and the first lower surface 51a1. The first lower surface 51a1 faces and/or contacts the first metal plate 51c. The first upper surface 51au is located on a side of the first metal layer 51a that is opposite to the first lower surface 51a1. The first upper surface 51au and the first lower surface 51a1 are in general parallel to the X-Y plane. The insulating material 40 may be in contact with at least a portion of the first upper surface 51au—that is, a portion the insulating material 40 may be disposed on the first upper surface 51au. The first upper surface 51au faces the semiconductor light-emitting element 10.

The second metal layer 52a has a second upper surface 52au and a second lower surface 52a1. The second lower surface 52a1 faces the second metal plate 52c. The second upper surface 52au is a face located on a side of the second metal layer 52a opposite to the second lower surface 52a1. The second upper surface 52au and the second lower surface 52a1 are in general parallel to the X-Y plane. The insulating material 40 may be in contact with at least a portion of the second upper surface 52au—that is, a portion the insulating material 40 may be disposed on the second upper surface 52au.

The third metal layer 53a has a third upper surface 53au and a third lower surface 53a1. The third lower surface 53a1 faces the third metal plate 53c. The third upper surface 53au is a face located on a side of third metal layer 53a opposite to the third lower surface 53a1. The third upper surface 53au and the third lower surface 53a1 are in general parallel to the X-Y plane. The insulating material 40 may be in contact with at least a portion of the third upper surface 53au—that is, a portion the insulating material 40 may be disposed on the third upper surface 53au.

By being in contact with or disposed on these upper surfaces (51au, 52au, 53au), the insulating material 40 may hold the metal members (51, 52, 53) more firmly. As a result, productivity is improved and reliability is improved.

In the example of the semiconductor light-emitting device 110, a lower surface 521f of the second metal member 52 is substantially located at a surface, which is in a plane parallel to the X-Y plane, including at least a portion of a lower surface 511f of the first metal member 51. A lower surface 531f of the third metal member 53 is also substantially located at the surface including at least a portion of a lower surface 511f of the first metal member 51. A lower surface 401f of the insulating material 40 is substantially located at the surface including at least a portion of a lower surface 511f of the first metal member 51.

Since these lower surfaces are located in substantially the same plane, electrical connection between these metal members is easily established in the implementation of the semiconductor light-emitting device 110 and the connection will have high reliability.

Hereinafter, the semiconductor light-emitting device 110 will be further described.

As illustrated in FIG. 1C, the semiconductor light-emitting element 10 includes a first semiconductor layer 11, a second semiconductor layer 12, and a third semiconductor layer 13. The first semiconductor layer 11 is of a first conductive type. The second semiconductor layer 12 is provided between the first semiconductor layer 11 and the first metal member 51. The second semiconductor layer 12 is of a second conductive type. For example, the first conductive type is an n type and the second conductive type is a p type. However, the first conductive type may be a p type and the second conductive type may be an n type. The third semiconductor layer 13 is provided between the first semiconductor layer 11 and the second semiconductor layer 12. The third semiconductor layer 13 is a light-emitting layer. The first semiconductor layer 11, the second semiconductor layer 12, and the third semiconductor layer 13 comprise nitride semiconductor materials, for example.

The first metal member 51 is electrically connected to the second semiconductor layer 12. The second metal member 52 is electrically connected to the first semiconductor layer 11.

The semiconductor light-emitting element 10 includes a pad portion 11p. The pad portion 11p is electrically connected to the first semiconductor layer 11. In this example, a first electrode 11e is provided. The first electrode 11e is electrically connected to the first semiconductor layer 11 and the pad portion 11p. The first electrode 11e is, for example, a thin wire electrode.

The semiconductor light-emitting element 10 further includes a substrate 15 and a second electrode 12e. The substrate 15 is provided on the second electrode 12e. The second semiconductor layer 12 is provided on the substrate 15. The third semiconductor layer 13 is provided on the second semiconductor layer 12. The first semiconductor layer 11 is provided on the third semiconductor layer 13. The first electrode 11e and the pad portion 11p are provided on a portion of the first semiconductor layer 11—that is, as depicted the first electrode 11e (e.g., a thin wire electrode) and the pad portion 11p do not completely cover the upper surface of the first semiconductor layer 11 (see FIG. 1) so light may be emitted from the upper surface of the first semiconductor layer. The substrate 15 can be conductive. Here, the substrate 15 comprises a metal making ohmic contact with the second semiconductor layer 12. A voltage is applied between the second electrode 12e and the pad portion 11p. As a result, a current flows through the third semiconductor layer 13 and a light is emitted. The semiconductor light-emitting element 10 is, for example, a light-emitting diode (LED).

The peak wavelength of the light emitted from the third semiconductor layer 13 is, for example, in a range of 400 nm to 480 nm. In this embodiment, the peak wavelength may be arbitrarily set according to the composition and structure of light-emitting element 10.

Between the first metal member 51 and the semiconductor light-emitting element 10, a bonding layer 22 is provided. The bonding layer 22 may be solder or conductive paste, for example. The semiconductor light-emitting element 10 is affixed to the first metal member 51 by the bonding layer 22. The first metal member 51 is electrically connected to the second electrode 12e. The first metal member 51 is electrically connected to the second semiconductor layer 12 via bonding layer 22, second electrode 12e, and substrate 15.

The semiconductor light-emitting device 110 includes wiring 21. One end of the wiring 21 is electrically connected to the pad portion 11p. The other end of the wiring 21 is electrically connected to the second metal member 52. By the application of a voltage between the first metal member 51 and the second metal member 52, a voltage is applied to the semiconductor light-emitting element 10 and a light is emitted.

In this example, a light transmission layer 23 is optionally provided. The semiconductor light-emitting element 10 is arranged between at least a portion of the light transmission layer 23 and the first metal member 51. The light transmission layer 23 functions as a lens in some embodiments. The light transmission layer 23 may also have a wavelength conversion function in some embodiments. In this example embodiment, a wavelength conversion layer 24 is provided between the light transmission layer 23 and the semiconductor light-emitting element 10. The wavelength conversion layer 24 absorbs a portion of light (first light) emitted from the semiconductor light-emitting element 10 at a first wavelength and emits light (second light) at a second wavelength different from the first wavelength. The peak wavelength of the second light is different from the peak wavelength of the first light. For example, the first light is blue and the second light is yellow or red. A light obtained by combining the first light and the second light becomes the emission light of the semiconductor light-emitting device 110.

As illustrated in FIGS. 1A and 1B, in this example, an electrical element 70 (for example, a Zener diode) is provided in the semiconductor light-emitting device 110. One end (first end) of the electrical element 70 is electrically connected to the first metal member 51 via third metal member 53 (and connection member 53x). The other end (second end) of the electrical element 70 is electrically connected to the second metal member 52. By providing the electrical element 70, the application of a reverse voltage to the semiconductor light-emitting element 10 may be suppressed.

Figure 2:
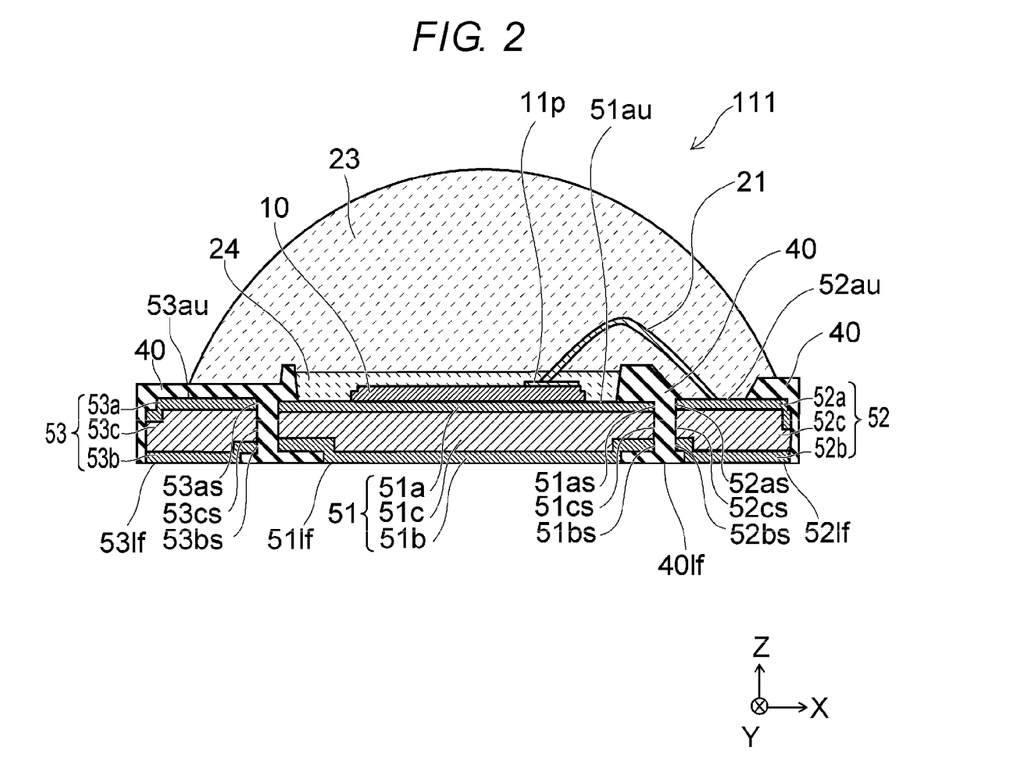
FIG. 2 is a schematic sectional view illustrating another semiconductor light-emitting device according to the first embodiment.

FIG. 2 is a schematic cross-sectional view illustrating another example of a semiconductor light-emitting device according to the first embodiment.

FIG. 2 is a diagram corresponding to the cross section taken on the line A1-A2 illustrated in FIGS. 1A and 1B for this example semiconductor light-emitting device 111.

As illustrated in FIG. 2, in semiconductor light-emitting device 111, a portion of at least one of the metal members (51, 52, 53) is located between portions of the insulating material 40 in the first direction (Z-axis). In addition, the thickness of the insulating material 40 varies. The semiconductor light-emitting device 111 is similar to the semiconductor light-emitting device 110 excepting for these aspects.

For example, a portion of the first metal member 51 is between a portion (first portion) of the insulating material 40 and another portion (second portion) of the insulating material 40 in the first direction. A portion of the second metal member 52 is between a portion (third portion) of the insulating material 40 and another portion (fourth portion) of the insulating material 40 in the first direction. A portion of the third metal member 53 can be disposed between a portion (fifth portion) of the insulating material 40 and another portion (sixth portion) of the insulating material 40 in the first direction. As a result, the metal members are vertically interposed between various portions of the insulating material 40, whereby firm holding of the metal members (51, 52, 53) is achieved.

In the semiconductor light-emitting device 111, the lower surface 401f of the insulating material 40 is substantially arranged along a surface (substantially parallel to the X-Y plane) including at least a portion of a lower surface 511f of the first metal member 51 with portions of the first metal member 51 being between portions of the insulating material 40 in the first direction. As a result, firm holding and a reliable electrical connection are achieved.

A portion of the insulating material 40 extends in the first direction from the first upper surface 51au of the first upper metal layer 51a to a distance that is greater than a distance to which other portions of the insulating material 40 extend from the second upper surface 52au of the second upper metal layer 52a or from the third upper surface 53au of the third upper metal layer 53a. For example, by making a portion of the insulating material 40 which is adjacent to and surrounding the semiconductor light-emitting element 10 to be thicker (along z-axis direction) than other portions, it may be easier to control of the shape of a resin during manufacturing (for example, the wavelength conversion layer 24) covering the semiconductor light-emitting element 10.

Figure 3:
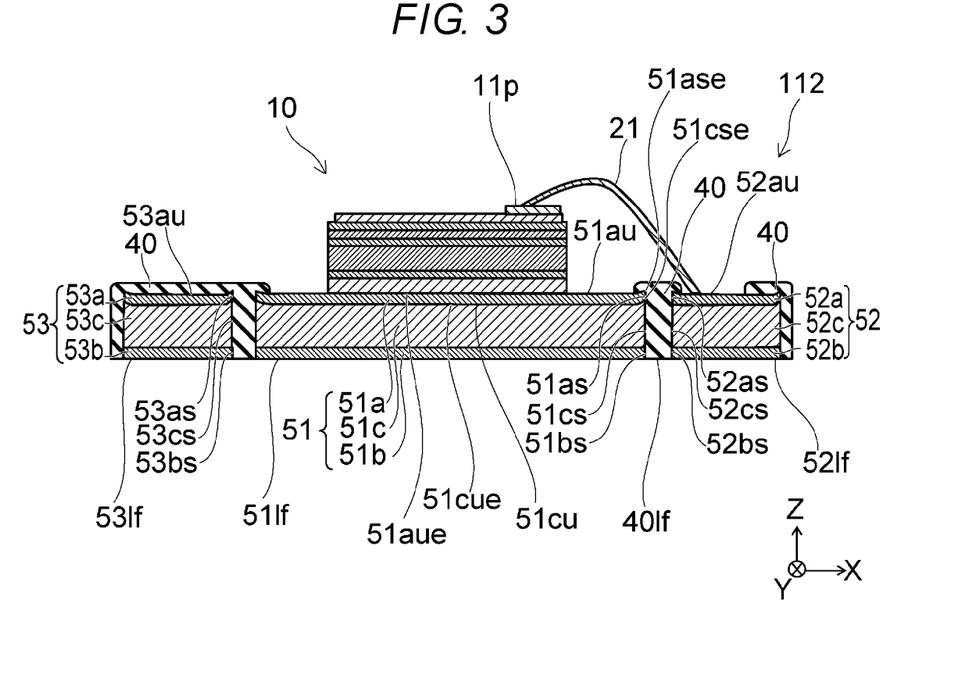
FIG. 3 is a schematic sectional view illustrating still another semiconductor light-emitting device according to the first embodiment.

FIG. 3 is a schematic sectional view illustrating another semiconductor light-emitting device according to the first embodiment.

FIG. 3 is a diagram corresponding to the cross section taken on the line A1-A2 illustrated in FIGS. 1A and 1B of another example of a semiconductor light-emitting device according to the first embodiment.

As illustrated in FIG. 3, in light-emitting device 112, a portion (edge portion) of the first upper surface 51au of the first metal plate 51c that is closer to the first metal plate side face 51cs (an outer edge of the first metal plate), is inclined with respect to the X-Y plane. On the other hand, a portion of the first upper surface 51au, the portion under the semiconductor light-emitting element 10 in the Z-axis direction, is substantially parallel to the X-Y plane. The semiconductor light-emitting device 112 is similar to the semiconductor light-emitting device 110 excepting for these aspects. Similarly, upper surface edge portions of second metal member 52 and third metal member 53 are also inclined with respect to the X-Y plane in a manner similar to the upper surface edge portions of first metal member 51. In FIG. 3, the light transmission layer 23 and the wavelength conversion layer 24 are omitted for clarity, but may be present in an actual device.

The shape of the edge portion of the first upper surface 51au (similarly second upper surface 52au and third upper surface 53au) which is inclined with respect to the X-Y plane, is formed in the process of forming the first metal member 51 (or second metal member 52 and third metal member 53), for example. For instance, when the material which becomes the metal member (51, 52, 53) is cut from the lower metal layer (51b, 52b, 53b) towards the upper metal layer (51a, 52a, 53a), the inclined, out-of-plane shape is formed, for example, the shape may correspond to a "burr."

For example, the first metal plate side face 51cs has an end 51cse on the side where the semiconductor light-emitting element 10 is located. The first metal plate 51c has an upper surface 51cu. The upper surface 51cu faces the first metal layer 51a. The upper surface 51cu has a portion 51cue overlapping the semiconductor light-emitting element 10 in the first direction (the Z-axis direction). The position of the end 51cse in the first direction is provided between the position of the portion 51cue in the first direction and the position of the semiconductor light-emitting element 10 in the first direction.

For example, the first metal layer side face 51as of the first metal layer 51a has an end 51ase on the side where the semiconductor light-emitting element 10 is located. The first metal layer 51a has the upper surface 51au on the side where the semiconductor light-emitting element 10 is located. The upper surface 51au has a portion 51aue below the semiconductor light-emitting element 10 in the first direction (the Z-axis direction). The position of the end 51ase in the first direction is provided between the position of the portion 51aue in the first direction and the position of the semiconductor light-emitting element 10 in the first direction.

In the semiconductor light-emitting device 112, a portion of the first metal plate 51c is located between the first metal layer 51a and the insulating material 40. A portion of the second metal plate 52c is located between the second metal layer 52a and the insulating material 40. A portion of the third metal plate 53c is located between the third metal layer 53a and the insulating material 40.

In such a configuration, for example, the contact area between the insulating material 40 and the first metal member 51 may be increased. For instance, in an area near the edge 51ase, the insulating material 40 places the first metal member (the burr portion) between different portions of the insulating material 40 in a direction intersecting the Z-axis direction. As a result, the first metal member 51 is held by the insulating material 40 more securely.

For example, in the above-described reference example the silver layer is provided over the entire surface of the metal plate. Furthermore, in the reference example, since the silver layer is provided on the metal member after it has been formed/cut, the silver is coated over the surface of the already formed "burr," therefore the silver coating will tend to smooth out the "burr" and reduce its prominence. As a result, the extent to which burr portion is sandwiched by the insulating material 40 in a direction intersecting the Z-axis direction is reduced, thus reducing holding strength.

Second Embodiment

This second embodiment is related to a method for producing a semiconductor light-emitting device.

FIGS. 4A to 4E are schematic cross-sectional views illustrating the method according to a second embodiment for producing a semiconductor light-emitting device. These diagrams illustrate as an example a method for producing the semiconductor light-emitting device 110.

Figure 4A:
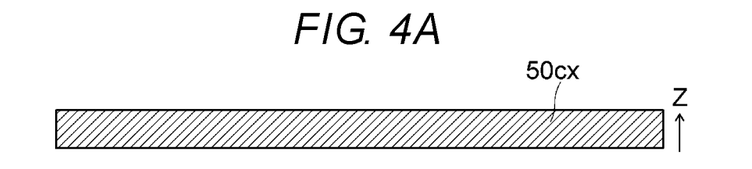
FIGS. 4A to 4E are schematic cross-sectional views illustrating a method for producing a semiconductor light-emitting device according to a second embodiment.

As illustrated in FIG. 4A, a metal plate 50cx comprising copper is prepared.

Figure 4B:
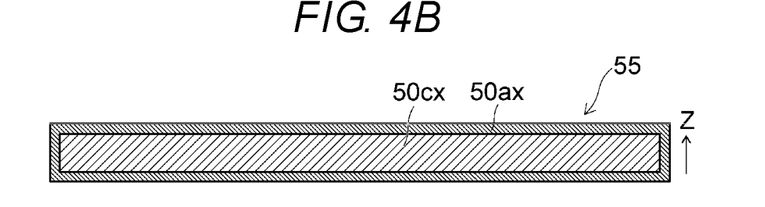

As illustrated in FIG. 4B, a film 50ax comprising silver is formed on the surface of the metal plate 50cx. As a result, a component 55 is formed. The component 55 includes the metal plate 50cx and the film 50ax on the surface of the metal plate 50cx.

Figure 4C:
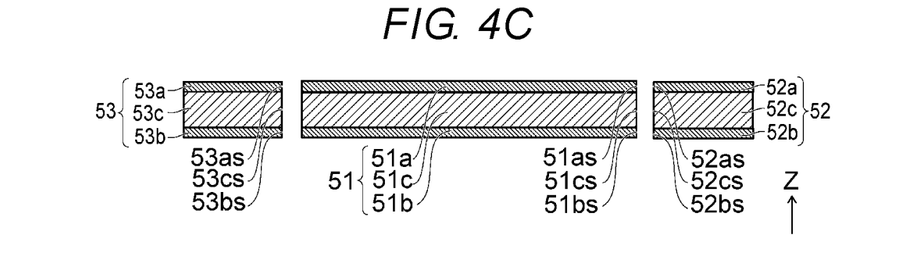

As illustrated in FIG. 4C, by cutting the component 55, the first metal member 51 is formed. In this example, the second metal member 52, and the third metal member 53 are also formed from the metal plate 50cx by cutting.

The first metal member 51 includes the first metal plate 51c having the first metal plate side face 51cs. The first metal plate 51c was a portion the metal plate 50cx, and the first upper metal layer 51a was a portion of the film 50ax. In this example, the first metal member 51 further includes the first lower metal layer 51b that was a portion of the film 50ax.

The second metal member 52 includes the second metal plate 52c having the second metal plate side face 52cs. The second metal plate 52c was a portion of the metal plate 50cx, and the second upper metal layer 52a was a portion of the film 50ax. In this example, the second metal member 51 further includes the second lower metal layer 52b that was a portion of the film 50ax.

The third metal member 53 includes the third metal plate 53c having the third metal plate side face 53cs. The third metal plate 53c was a portion of the metal plate 50cx, and the third upper metal layer 53a was a portion of the film 50ax. In this example, the third metal member 53 further includes the third lower metal layer 53b that was a portion of the film 50ax.

Figure 4D:
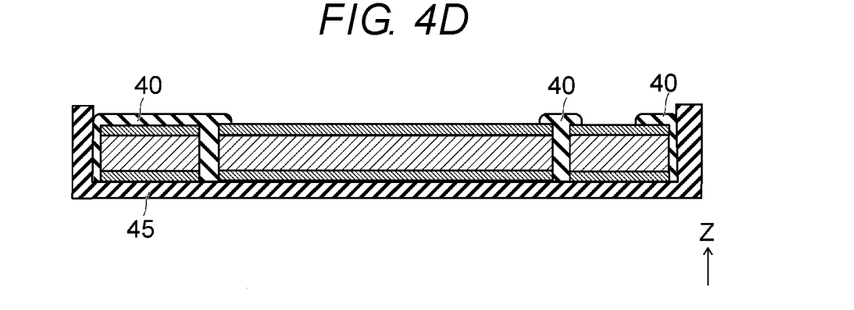

As illustrated in FIG. 4D, the insulating material 40 containing a silicon oxide is formed. For example, the insulating material 40 is molded using a mold 45. The insulating material 40 is in contact with the first metal plate side face 51cs. The insulating material 40 may be in contact with the second metal plate side face 52cs and the third metal plate side face 53cs as well. The insulating material 40 may be in contact with the first upper metal layer side face 51as, the second upper metal layer side face 52as, and the third upper metal layer side face 53as. The insulating material 40 may be in contact with the first lower metal layer side face 51bs, the second lower metal layer side face 52bs, and the third lower metal layer side face 53bs.

Figure 4E:
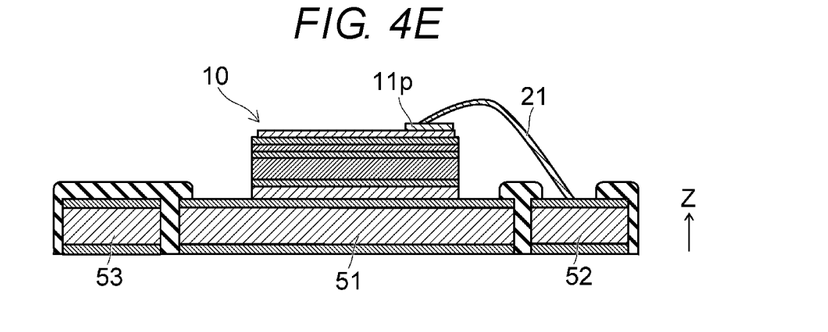

As illustrated in FIG. 4E, the semiconductor light-emitting element 10 is on the first upper metal layer 51a. Connection by the wiring 21 is made, if necessary.

As a result, the semiconductor light-emitting device 110 is fabricated. Owing to this production method, a semiconductor light-emitting device may be formed with increased.

In the configuration in which copper (or a copper oxide) is on the first metal plate side face 51cs and the insulating material 40 is in contact the first metal plate side face 51cs, when temperature stress such as a high temperature or a low temperature is applied to the semiconductor light-emitting device 110, silver having a low adhesion (for example, the first upper metal layer 51a) reduces the stress caused by the thermal expansion or the like of the insulating material 40. As a result, reliability is increased.

Figure 5A:
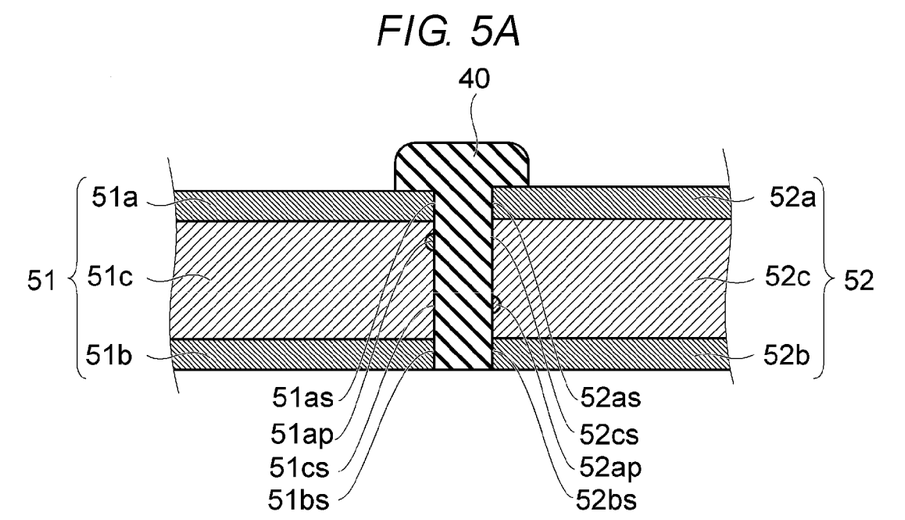
FIGS. 5A and 5B are schematic cross-sectional views illustrating a portion of another semiconductor light-emitting device according to the second embodiment.
Figure 5B:
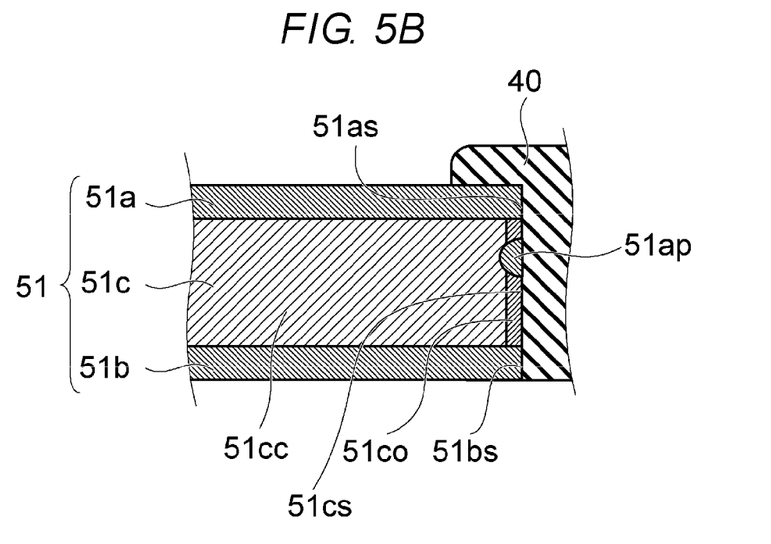

FIGS. 5A and 5B are schematic sectional views illustrating a portion of a semiconductor light-emitting device according to an embodiment.

As illustrated in FIG. 5A, a region (a first region 51ap) containing silver may be provided on the first metal plate side face 51cs. A region (a second region 52ap) containing silver may be provided on the second metal plate side face 52cs. Occasionally, when the metal member is being processed, a chip or flake containing silver produced from the silver metal coating (e.g., 51a, 51b, 52a, 52b) or otherwise during the cutting or the like of the metal member will adhere to the metal plate side face (e.g., 51cs and/or 52cs). The silver-containing region (e.g., 51ap and/or 52ap) is formed on the metal plate side face in such a case. In the case of this example, the first metal plate side face 51cs includes a region containing copper and a region containing silver (first region 51ap). Depending on the processing conditions, the first metal plate side face 51cs sometimes contains copper and oxygen (e.g., region 51co, see FIG. 5B).

As illustrated in FIG. 5B, the first region 51ap may be provided in a region 51co proximate to the first metal plate side face 51cs. In this case, the first metal plate side face 51cs includes the region containing copper and oxygen (region 51co) and the region containing silver (first region 51ap). Depending on the processing conditions, the first metal plate side face 51cs may sometimes contain copper, oxygen, and silver.

Also in the example illustrated in FIGS. 5A and 5B, for example, a crack in the insulating material 40 would be suppressed, therefore a high yield, productivity, and reliability is achieved.

According to the embodiments described above, the semiconductor light-emitting device and the method for producing the semiconductor light-emitting device, the device and the method that may increase productivity, may be provided.

Incidentally, in the present specification, the "nitride semiconductor material" is assumed to include semiconductors of all the compositions represented in the chemical formula $B_xIn_yAl_zGa_{1-x-y-z}N$ ($0 \leq x \leq 1$, $0 \leq y \leq 1$, $0 \leq z \leq 1$, $x+y+z \leq 1$) within the ranges thereof. Moreover, the "nitride semiconductor material" is also assumed to include various group V elements other than N (nitrogen), various elements (dopants) which are added to control various physical properties such a conductivity type, and various elements present as normal an expected contaminants that are unintentionally present in the material represented by the chemical formula described above.

Incidentally, in the present disclosure, a "perpendicular" and a "parallel" include not only a strictly perpendicular and a strictly parallel state, but also variations caused in the production process, for example, and simply have to be a substantially perpendicular and a substantially parallel such as within normal manufacturing tolerances.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light-emitting device, comprising:
   a semiconductor light-emitting element;
   a first metal member including a first metal plate and a first metal layer between the semiconductor light-emitting element and a first surface of the first metal plate;
   an insulating layer comprising silicon oxide contacting a second surface of the first metal plate; and
   a second metal member including a second metal plate and a second metal layer on at least a portion of a surface of the second metal plate,
   wherein the first metal plate comprises copper, the first metal layer comprises silver, the second surface is in a second plane that crosses a first plane of the first surface, and the surface of the second metal plate is substantially parallel to the first plane,
   wherein
   the first metal layer has a first metal layer side face intersecting the first plane,
   the insulating layer is in contact with the first metal layer side face,
   the second metal plate comprises copper,
   the second metal layer comprises silver,
   the second metal member is adjacent to the first metal member in a direction intersecting the second plane,
   the second metal plate has a second metal plate side face in a plane intersecting the first plane, and
   the insulating layer is in contact with the second metal plate side face.

2. The semiconductor light-emitting device according to claim 1, wherein
   the semiconductor light-emitting element includes:
      a first semiconductor layer of a first conductivity type,
      a second semiconductor layer of a second conductivity type between the first semiconductor layer and the first metal member, and
      a third semiconductor layer between the first semiconductor layer and the second semiconductor layer;
   the first metal member is electrically connected to the second semiconductor layer; and
   the second metal member is electrically connected to the first semiconductor layer.

3. The semiconductor light-emitting device according to claim 1, wherein a content of the silicon oxide in the insulating layer is 40 mass % or more.

4. The semiconductor light-emitting device according to claim 1, wherein the insulating layer further contains a plurality of particles containing zinc oxide.

5. The semiconductor light-emitting device according to claim 1, wherein a thickness of the first metal plate is 500 times to 5,000 times a thickness of the first metal layer.

6. The semiconductor light-emitting device according to claim 1,
   wherein the first metal plate includes:
      a first region of copper, and
      a second region of a copper oxide between the first region and the insulating layer.

7. The semiconductor light-emitting device according to claim 2, wherein a content of the silicon oxide in the insulating layer is 40 mass % or more.

8. The semiconductor light-emitting device according to claim 2, wherein the insulating layer further contains a plurality of particles containing zinc oxide.

9. The semiconductor light-emitting device according to claim 2, wherein a thickness of the first metal plate is 500 times to 5,000 times a thickness of the first metal layer.

10. The semiconductor light-emitting device according to claim 2, wherein the first metal plate includes:
   a first region of copper, and
   a second region of a copper oxide between the first region and the insulating layer.

* * * * *